(12) United States Patent
Mitsui et al.

(10) Patent No.: US 12,105,152 B2
(45) Date of Patent: Oct. 1, 2024

(54) BATTERY CAPACITY ESTIMATION METHOD AND BATTERY CAPACITY ESTIMATION SYSTEM

(71) Applicant: TOYOTA JIDOSHA KABUSHIKI KAISHA, Toyota (JP)

(72) Inventors: Masahiko Mitsui, Toyota (JP); Junta Izumi, Nagoya (JP); Juni Yasoshima, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 157 days.

(21) Appl. No.: 17/893,997

(22) Filed: Aug. 23, 2022

(65) Prior Publication Data

US 2022/0397611 A1 Dec. 15, 2022

Related U.S. Application Data

(62) Division of application No. 16/722,509, filed on Dec. 20, 2019, now Pat. No. 11,480,618.

(30) Foreign Application Priority Data

Dec. 26, 2018 (JP) ................. 2018-243294

(51) Int. Cl.
*G01R 31/3828* (2019.01)
*G01R 31/36* (2020.01)
(Continued)

(52) U.S. Cl.
CPC ..... *G01R 31/3828* (2019.01); *G01R 31/3648* (2013.01); *G01R 31/389* (2019.01); *H02J 7/00036* (2020.01)

(58) Field of Classification Search
None
See application file for complete search history.

(56) References Cited

U.S. PATENT DOCUMENTS

2018/0143257 A1* 5/2018 Garcia ................. G01R 31/382
2020/0033414 A1 1/2020 Izumi et al.
(Continued)

FOREIGN PATENT DOCUMENTS

CN 103091642 A 5/2013
CN 107144790 A 9/2017
(Continued)

OTHER PUBLICATIONS

Troltzsch et al., "Characterizing aging effects of lithium ion batteries by impedance spectroscopy", Electrochimica Acta, Jan. 20, 2006, vol. 51, Issues 8-9, pp. 1664-1672 (Year: 2006).*
(Continued)

*Primary Examiner* — Brent A. Fairbanks
(74) *Attorney, Agent, or Firm* — Sughrue Mion, PLLC

(57) ABSTRACT

A battery capacity estimation system executes a charging and discharging process (S1), an alternating current impedance acquiring process (S2 and S3), and a battery capacity estimating process (S4 to S6). The charging and discharging process involves charging and discharging a target secondary battery. The alternating current impedance acquiring process involves acquiring a measurement result of an alternating current impedance of a target secondary battery, by applying an alternating current signal within a specific frequency range to the target secondary battery after completion of the charging and discharging in the charging and discharging process and before a predetermined maximum waiting time elapses. The battery capacity estimating step involves estimating a battery capacity of the target secondary battery based on the measurement result of the alternating current impedance.

2 Claims, 8 Drawing Sheets

(51) Int. Cl.
*G01R 31/389* (2019.01)
*H02J 7/00* (2006.01)

(56) References Cited

U.S. PATENT DOCUMENTS

2020/0041570 A1    2/2020  Izumi et al.
2020/0153264 A1*   5/2020  Osada .................... G06N 3/04

FOREIGN PATENT DOCUMENTS

| | | |
|---|---|---|
| JP | 2003-317810 A | 11/2003 |
| JP | 2016-90346 A | 5/2016 |
| JP | 2018-18354 A | 2/2018 |
| JP | 2018146441 A | 9/2018 |
| JP | 2020020604 A | 2/2020 |
| JP | 2020021592 A | 2/2020 |
| WO | 2017/050944 A1 | 3/2017 |

OTHER PUBLICATIONS

Andre et al., "Characterization of high-power lithium-ion batteries by electrochemical impedance spectroscopy", Jun. 15, 2011, Journal of Power Sources, vol. 196, Issue 12, pp. 5334-5341 (Year: 2011).*

Barai, et al., "A study of the effect of short-term relaxation on the EIS test technique for EV battery cells", 2015, International Workshop on Impedance Spectroscopy (Year: 2015).

Jesperson et al., "Capacity Measurements of Li-Ion Batteries using AC Impedance Spectroscopy", Mar. 27, 2009, World Electr. Veh. J. 2009, pp. 127-133. (Year: 2009).

* cited by examiner

BATTERY CAPACITY ESTIMATION METHOD AND BATTERY CAPACITY ESTIMATION SYSTEM

CROSS REFERENCE TO RELATED APPLICATIONS

The present application is a divisional of U.S. application Ser. No. 16/722,509, filed Dec. 20, 2019, which claims priority from Japanese Patent Application No. 2018-243294 filed on Dec. 26, 2018, which is incorporated by reference herein in its entirety.

BACKGROUND

The present disclosure relates to a battery capacity estimation method and a battery capacity estimation system that are used to estimate the capacity of a secondary battery.

Secondary batteries are widely used as a portable power source for various devices such as personal computers and mobile terminals, and as a vehicle power source for various vehicles such as electric vehicles (EVs), hybrid vehicles (HVs), and plug-in hybrid vehicles (PHVs). The secondary batteries that have been used onboard the vehicles may be removed and collected. It is desirable that, if usable, the collected secondary batteries be reused. However, secondary batteries can deteriorate over time and repeated charging and discharging. The degree of deterioration in secondary batteries is different from one battery to another. For this reason, it is desirable that the performance of each of the collected secondary batteries should be evaluated, and according to the results of the evaluation, the policy on how to reuse each of the secondary batteries should be determined. In addition, not only in determining the policy on how to reuse collected secondary batteries, it is desirable to evaluate the performance of a secondary battery in many cases.

Various techniques have been proposed for evaluating performance and characteristics of secondary batteries. For example, JP 2003-317810 A proposes a method of evaluating battery characteristics that involves determining the presence or absence of micro-short circuit in a secondary battery, based on a reaction resistance value of the secondary battery that is acquired by an alternating current impedance measurement method.

SUMMARY

In estimating the capacity of a secondary battery using an alternating current impedance measurement method, variations may occur in the results of the estimation in some cases, even when the same alternating current impedance measurement technique is used to estimate the capacity of the same secondary battery. It is desirable to further increase the accuracy of estimation of the capacity.

In an embodiment of the present disclosure, a battery capacity estimation method may include: a charging and discharging step of charging and discharging a target secondary battery; an alternating current impedance acquiring step of acquiring a measurement result of an alternating current impedance of the target secondary battery, by applying an alternating current signal within a specific frequency range to the target secondary battery after completion of the charging and discharging in the charging and discharging step and before a predetermined maximum waiting time elapses; and a battery capacity estimating step of estimating a battery capacity of the target secondary battery based on the measurement result of the alternating current impedance.

The inventors of the present application have discovered that variations in the results of battery capacity estimation based on alternating current impedance change according to elapsed time after completion of charging and discharging of a secondary battery until the alternating current impedance is measured. Specifically, it has been found from the results of experiments conducted by the inventors that variations in the estimation results become smaller when the elapsed time after completion of the charging and discharging until the alternating current impedance is measured is shorter than the maximum waiting time that is determined according to the conditions such as the type of the secondary battery. The above-described battery capacity estimation method estimates battery capacity based on the alternating current impedance that is measured after completion of charging and discharging of the secondary battery and before the maximum waiting time elapses. As a result, the capacity of the target secondary battery is estimated with higher accuracy.

It should be noted that the maximum waiting time varies depending on conditions such as the type of the secondary battery, whether or not the secondary battery is a battery pack, and the structure of the battery pack if the secondary battery is a battery pack. Accordingly, the maximum waiting time may be determined as appropriate, for example, through experimentation, depending on the conditions such as the type of the secondary battery and so forth.

In a preferable embodiment of the battery capacity estimation method disclosed herein, in the alternating current impedance acquiring step, the measurement result of the alternating current impedance of the target secondary battery is acquired within a period in which an elapsed time after completion of the charging and discharging in the charging and discharging step is longer than a predetermined minimum waiting time and shorter than the maximum waiting time.

The inventors of the present application has discovered that variations in the results of battery capacity estimation become even smaller when the elapsed time after completion of the charging and discharging of the secondary battery until the alternating current impedance is measured is longer than the minimum waiting time and shorter than the maximum waiting time, the minimum waiting time and the maximum waiting time being determined according to the conditions such as the type of the secondary battery. Accordingly, the battery capacity of the target secondary battery can be estimated with higher accuracy by setting the elapsed time after completion of the charging and discharging of the secondary battery until the alternating current impedance is measured to be longer than the minimum waiting time and shorter than the maximum waiting time. It should be noted that, like the maximum waiting time, the minimum waiting time may also be determined as appropriate depending on the conditions such as the type of the secondary battery and so forth.

In another embodiment of the battery capacity estimation device disclosed herein, the battery capacity estimating step involves obtaining an estimation result of the battery capacity of the target secondary battery by inputting data based on a Nyquist plot of the target secondary battery into a pre-trained neural network model. The pre-trained neural network model performs learning using a plurality of training data including data based on a plurality of Nyquist plots indicating measurement results of alternating current impedance of a plurality of secondary batteries and actual battery capacities of the plurality of secondary batteries.

In this case, it is possible to acquire the estimation result of the battery capacity of the target secondary battery easily and appropriately by properly training the neural network model, without executing a complicated process (such as the process of analyzing the measurement results of alternating current impedance). It is also possible, however, to estimate the battery capacity based on other algorithms without using the neural network model.

In another embodiment of the battery capacity estimation method disclosed herein, the pre-trained neural network model may be trained based on the training data including data relating to Nyquist plots of secondary batteries after completion of the charging and discharging and before the maximum waiting time elapses.

In this case, the time condition for obtaining the Nyquist plots of the target secondary battery is in agreement with the time condition for obtaining the Nyquist plots used for training the neural network model. Therefore, the pre-trained neural network model is optimized for estimating the battery capacity of the target secondary battery based on the Nyquist plot obtained before the elapse of the maximum waiting time. As a result, the accuracy of estimation of the battery capacity is further improved.

When the alternating current impedance of the target secondary battery is to be acquired in a period from the minimum waiting time to the maximum waiting time after the charging and discharging, the Nyquist plots used for training the neural network model may also be obtained in the period from the minimum waiting time to the maximum waiting time after the charging and discharging. This serves to further optimize the pre-trained neural network model.

In another embodiment of the present disclosure, a battery capacity estimation system includes: a charging and discharging process of charging and discharging a target secondary battery; an alternating current impedance acquiring process of acquiring a measurement result of an alternating current impedance of the target secondary battery by applying an alternating current signal within a specific frequency range to the target secondary battery after completion of the charging and discharging process by the charging and discharging process and before a predetermined maximum waiting time elapses; and a battery capacity estimating process of estimating a battery capacity of the target secondary battery based on the measurement result of the alternating current impedance. In this case, the capacity of the target secondary battery is estimated with high accuracy, as with the battery capacity estimation method.

In another embodiment of the battery capacity estimation system disclosed herein, in the alternating current impedance acquiring process, the measurement result of the alternating current impedance of the target secondary battery is acquired within a period in which an elapsed time after completion of the charging and discharging by the charging and discharging process is longer than a predetermined minimum waiting time and shorter than the maximum waiting time. In this case, the capacity of the target secondary battery is estimated with high accuracy, as with the battery capacity estimation method.

In another embodiment of the present disclosure, a battery capacity estimation system may include: a charging and discharging device executing the charging and discharging process; a measurement device executing the alternating current impedance acquiring process; and a battery capacity estimation device executing the battery capacity estimating process. In this case, the foregoing processes are executed appropriately by the respective devices. However, it is also possible to modify the configuration of the battery capacity estimation system. For example, the same one of the devices may execute a plurality of the processes. For example, the measurement device may execute the charging and discharging process and the alternating current impedance acquiring process together. It is also possible that one of the processes may be executed by a plurality of the devices that cooperate with each other.

DETAILED DESCRIPTION

Figure 1:
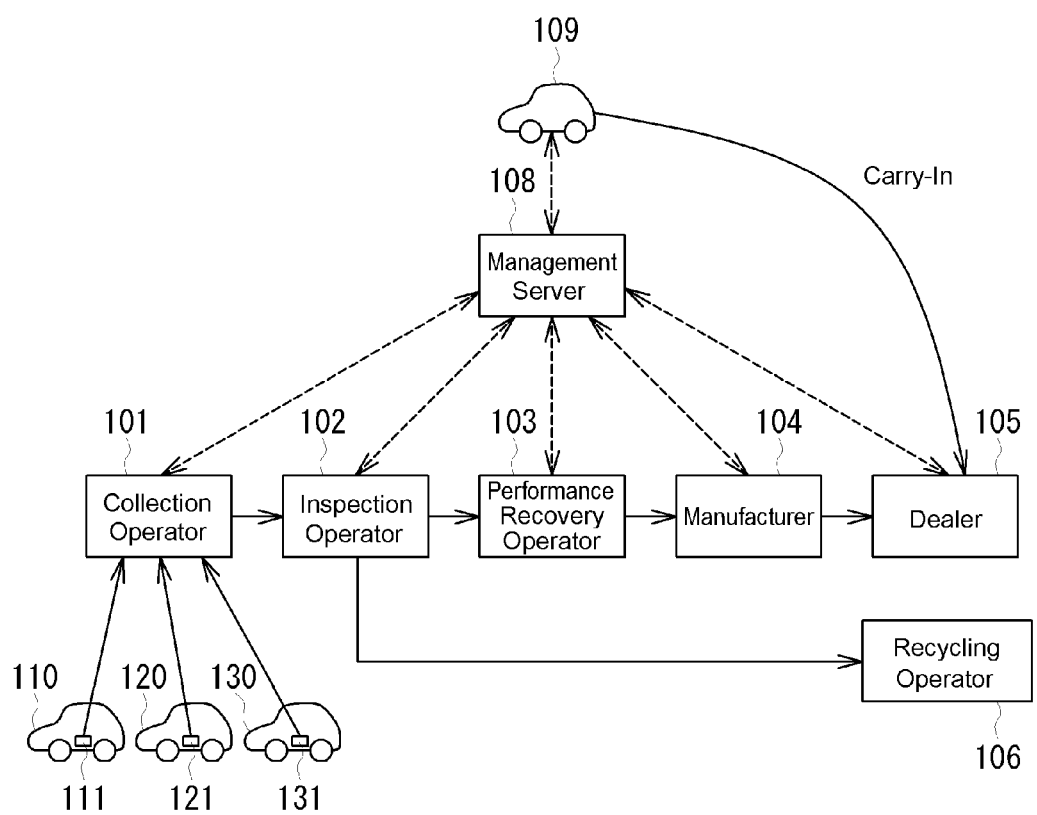
FIG. 1 is a view illustrating an example of logistics of secondary batteries, including collection, manufacturing, and sales of secondary batteries according to the present embodiment.

Hereinbelow, embodiments of the present disclosure will be described in detail with reference to the drawings. It should be noted that the matters not specifically described in this description but necessary to carry out the embodiments can be understood as design variations by a skilled person based on the prior art in the related field. The present invention may be implemented based on the contents disclosed herein and the common general technical knowledge in the related field. Throughout the drawings, identical reference characters and descriptions are used to designate like elements or features. It should be noted that dimensional relationships in the drawings do not necessarily reflect actual dimensional relationships.

The present embodiment describes an example of estimating the capacity of a secondary battery that has been used onboard a vehicle. Specifically, in the present embodiment, a secondary battery that has been carried onboard a vehicles is collected, then the capacity of the collected secondary battery is estimated, and the policy on how to reuse the secondary battery is determined according to the result of the estimation. It should be noted, however, that at least part of the technology illustrated in the present disclosure can be applied also to other situations (for example, a situation in which the capacity of a secondary battery used in a device other than a vehicle is to be estimated, or a situation in which the capacity of a newly manufactured secondary battery is to be estimated).

In the present embodiment, the battery pack carried onboard a vehicle includes a plurality of modules. The plurality of modules may be either connected in series or connected in parallel with each other. Each of the modules includes a plurality of battery cells (unit cells) connected in series.

In the present embodiment, a battery pack collected from a vehicle is disassembled into modules, and thereafter, the capacity of each of the modules is estimated module by module. As a result of the capacity estimation, a module that is determined to be reusable is reused (rebuilt) as a part of a newly manufactured battery pack. However, depending on the structure of the battery pack, it is also possible to estimate the capacity based on the shape of a battery pack without disassembling the battery pack. Furthermore, it is also possible to estimate the capacity for each of the battery cells that make up a module.

In the present embodiment, the secondary battery cell (each of the battery cells that make up the module) is a nickel-metal hydride battery. Specifically, the positive electrode includes nickel hydroxide [$Ni(OH)_2$] containing a cobalt oxide additive. The negative electrode includes a hydrogen-absorbing alloy ($MnNi_5$-based alloy, which is a nickel-based alloy). The electrolyte solution includes potassium hydroxide (KOH). However, this is merely an illustrative example of specific cell structure, and it is possible to apply the technique illustrated in the present disclosure to various other types of secondary batteries.

Battery Logistics Model

With reference to FIG. 1, an embodiment of logistics of secondary batteries, including collection, manufacturing (recycling), and sales of secondary batteries according to the present embodiment will be described. In the example shown in FIG. 1, a collection operator 101 collects used secondary batteries (battery packs) 111, 121, and 131 from vehicles 110, 120, and 130. Although only three vehicles 110, 120, and 130 are illustrated in FIG. 1, secondary batteries are collected from a greater number of vehicles in a real situation. The collection operator 101 disassembles the collected battery packs to obtain a plurality of modules from each of the battery packs. In the example shown in FIG. 1, an identification number is assigned to each of the modules, and the information about each of the modules is managed by a management server 108. The collection operator 101 transmits the identification numbers of the modules obtained from the battery packs to the management server 108 using a terminal device (not shown).

An inspection operator 102 carries out performance evaluation for each of the modules collected by the collection operator 101. For example, the inspection operator 102 assesses at least one electrical characteristic of each of the modules, including the battery capacity (for example, fully charged capacity), the resistance value, the open circuit voltage (OCV), and the state of charge (SOC) of each of the modules. The inspection operator 102 determines a plan for reusing the modules based on the results of the evaluation. For example, the inspection operator 102 separates the modules into reusable modules and non-reusable modules based on the results of the evaluation, and hands over the reusable modules to a performance recovery operator 103 and the non-reusable modules to a recycling operator 106. The results of the performance evaluation for each of the modules is transmitted to a management server 108 by a terminal (not shown) of the inspection operator 102.

The performance recovery operator 103 carries out a process for recovering the performance of the modules that have been determined as reusable by the inspection operator 102. In an example, the performance recovery operator 103 charges the modules to an overcharged state so as to recover the fully charged capacity of the modules. However, it is possible that the performance recovery process by the performance recovery operator 103 may be eliminated for the modules that have been evaluated to have low performance degradation in the performance evaluation by the inspection operator 102. The results of the performance recovery for each of the modules is transmitted to the management server 108 by a terminal (not shown) of the performance recovery operator 103.

A manufacturer 104 manufactures battery packs using the modules of which the performance recovery operator 103 have recovered the performance. For example, the manufacturer 104 may replace a module showing degraded performance in a battery pack of a vehicle 109 with a module of which the performance recovery operator 103 have recovered the performance, to manufacture (rebuild) the battery pack of the vehicle 109.

A dealer 105 may sell the battery packs manufactured by the manufacturer 104 as battery packs for vehicle use or as battery packs for stationary use that may be usable in residential settings. A recycling operator 106 disassembles the modules that have been determined as non-reusable by the inspection operator 102, and recycles the modules for using them as a material for new battery cells or the like.

Note that FIG. 1 depicts the collection operator 101, the inspection operator 102, the performance collection operator 103, the manufacturer 104, the dealer 105, and the recycling operator 106 as different business entities. However, the types of business entities are not limited to the examples shown in FIG. 1. For example, the inspection operator 102 and the performance recovery operator 103 may be the same business entity. Also, the collection operator 101 may be fulfilled by two separate operators, one that collects battery packs and the other that disassembles the collected battery packs. The base locations of the operators and dealers are not limited to specific locations, and a plurality of operators are based at either the same location or different locations.

The following description is provided to illustrate an example in which performance evaluation (particularly estimation of battery capacity) is performed for a module M that may be contained in battery packs 111, 112, and 113 collected from vehicles 110, 120, and 130, and according to the evaluation result, the policy on how to reuse the module M is determined. That is, in the present embodiment, the target secondary battery, the battery capacity of which is to be estimated, is the module M. However, the target secondary battery may be a single battery cell, or may be an entire battery pack including a plurality of modules M.

Battery Capacity Estimation System

Figure 2:
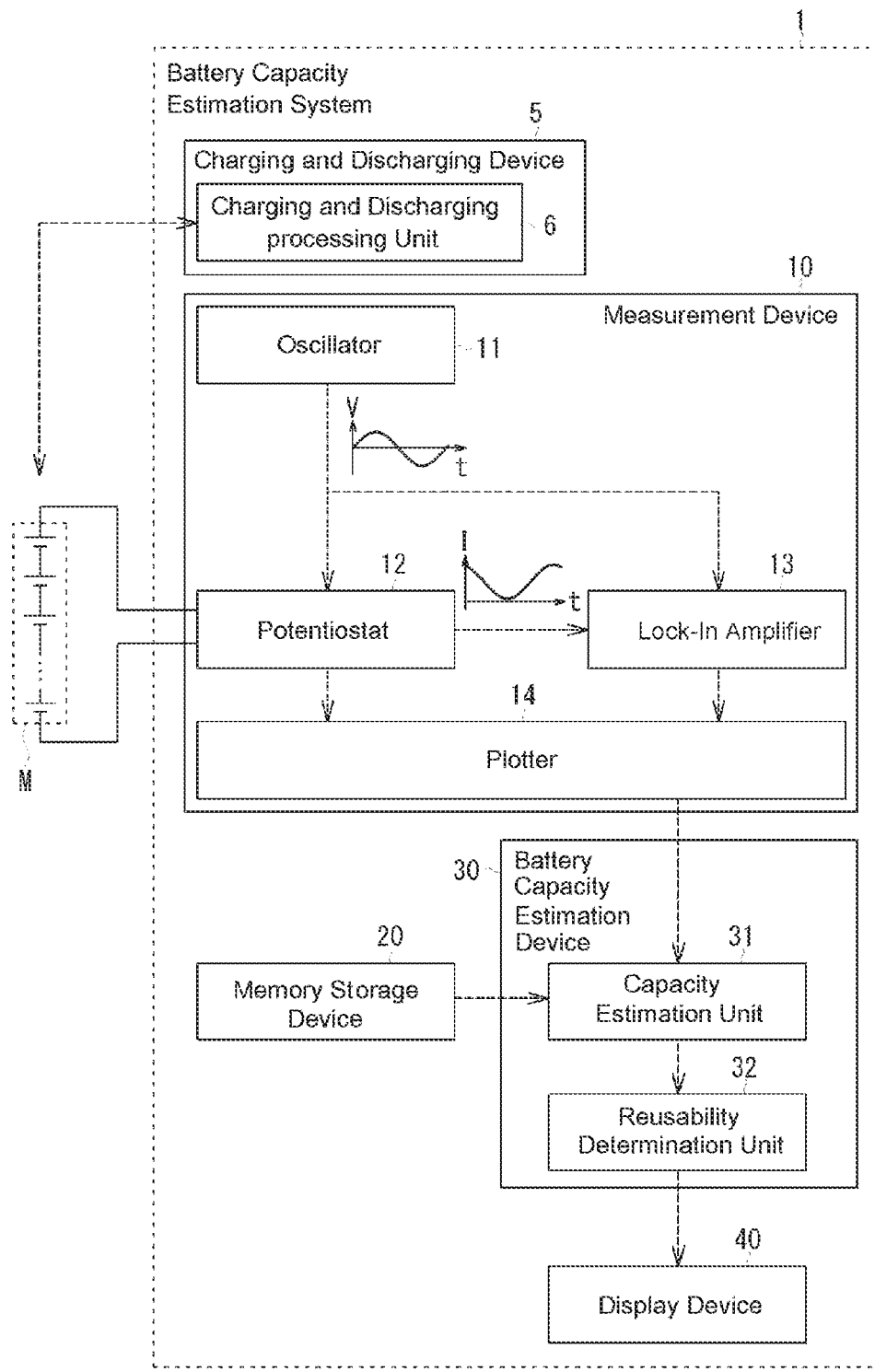
FIG. 2 is a view illustrating a configuration of a battery performance evaluation system 1.

With reference to FIG. 2, a battery capacity estimation system 1 according to the present embodiment will be described. In the battery logistics model shown in FIG. 1, the battery capacity estimation system 1 is provided for the inspection operator 102, for example. The battery capacity estimation system 1 according to the present embodiment includes a charging and discharging device 5, a measurement device 10, a memory storage device 20, a battery capacity estimation device 30, and a display device 40. These devices may be independent of each other, or two or more of these devices may be combined into one device.

The charging and discharging device 5 performs charging and discharging of a module M that is in a condition before the alternating current impedance is measured. For example, the battery capacity estimation system 1 causes the charging and discharging device 5 to perform charging and discharging of the module M so as to adjust the SOC of the module M to be in a desired range, and thereafter, allows the measurement device 10 to conduct the later-described measurement of alternating current impedance. The charging and discharging process is executed by a charging and discharging processing unit 6 provided for the charging and discharging device 5. However, the charging and discharging of the module M before the alternating current impedance measurement may also be carried out by a device other than the charging and discharging device 5 (for example, by the measurement device 10).

The measurement device 10 measures the alternating current impedance of the module M, and outputs a Nyquist plot indicating the measurement result to the battery capacity estimation device 30. More specifically, the measurement device 10 of the present embodiment includes an oscillator 11, a potentiostat 12, a lock-in amplifier 13, and a plotter 14.

The oscillator 11 outputs sine waves of the same phase to the potentiostat 12 and the lock-in amplifier 13.

The potentiostat 12 generates an alternating current application signal by superposing a predetermined direct current voltage on an alternating current voltage (for example, a voltage with an amplitude of about 10 mV) that is in the same phase as that of the sine wave output from the oscillator 11, and applies the generated application signal to the module M. The potentiostat 12 detects the electric current flowing through the module M, and outputs the detection result of the electric current to the lock-in amplifier 13 as a response signal from the module M. The potentiostat 12 also outputs the application signal and the response signal to the plotter 14.

The lock-in amplifier 13 compares the phase of the sine wave that is output from the oscillator 11 and the phase of the response signal that is output from the potentiostat 12, and outputs the result of the comparison (i.e., the phase difference between the sine wave and the response signal) to the plotter 14.

The plotter 14 plots the measurement results of the alternating current impedance of the module M onto a complex plane based on the signal from the potentiostat 12 (the signal indicating the amplitude ratio of the application signal and the response signal) and the signal from the lock-in amplifier 13 (the signal indicating the phase difference between the application signal and the response signal). More specifically, the frequency of the sine wave that is output from the oscillator 11 is swept over a predetermined frequency range, and the above-described processes by the potentiostat 12 and the lock-in amplifier 13 are executed repeatedly. Thereby, the measurement results of alternating current impedance of the module M for various frequencies of the sine wave are plotted on a complex plane. The generated plot is referred to as a Nyquist plot (which may be also referred to as a Cole-Cole plot). The Nyquist plot of the module M is output to the battery capacity estimation device 30.

It should be noted that the configuration of the measurement device 10 is not limited to that illustrated in FIG. 2. For example, it is described that the potentiostat 12 of the present embodiment applies an alternating current voltage to the module M and detects the electric current passing through the module M while applying the voltage. However, it is also possible that the potentiostat 12 may detect a voltage response while applying an alternating current to the module M. It is also possible that the measurement device 10 may include a frequency response analyzer in place of the lock-in amplifier 13.

Furthermore, it is also possible to modify the technique of the alternating current impedance measurement. For example, it is also possible that the measurement device 10 may generate an application signal containing various frequency components within a predetermined frequency range (either one of voltage signal or current signal) and it may detect the response signal (the other one of voltage signal or current signal) while applying the application signal. It is also possible that the measurement device 10 may calculate an alternating current impedance for each of the frequencies by performing a fast Fourier transform on each of the application signal and the response signal.

The memory storage device 20 stores a pre-trained neural network model that causes the battery capacity estimation device 30 to execute a process of estimating a battery capacity (a fully charged capacity in the present embodiment) of the module M. In response to a request from the battery capacity estimation device 30, the memory storage device 20 executes processes such as learning of the neural network model, updating of learning results, and outputting of the learning results to the battery capacity estimation device 30.

The battery capacity estimation device 30 includes a controller (for example, a CPU), a memory, and input/output ports. Specifically, the battery capacity estimation device 30 is provided with the functions of a capacity estimation unit 31 and a reusability determination unit 32. Although the details will be described later, the capacity estimation unit 31 estimates the battery capacity (the fully charged capacity in the present embodiment) of the module M based on the alternating current impedance of the module M that has been measured by the measurement device 10. This process is referred to as a "battery capacity estimating process" in the present embodiment. The reusability determination unit 32 determines how the module M is reused according to the result of estimation of the battery capacity of the module M. The reusability determination unit 32 may determine whether or not the module M can be reused.

Nyquist Plot

Figure 3:
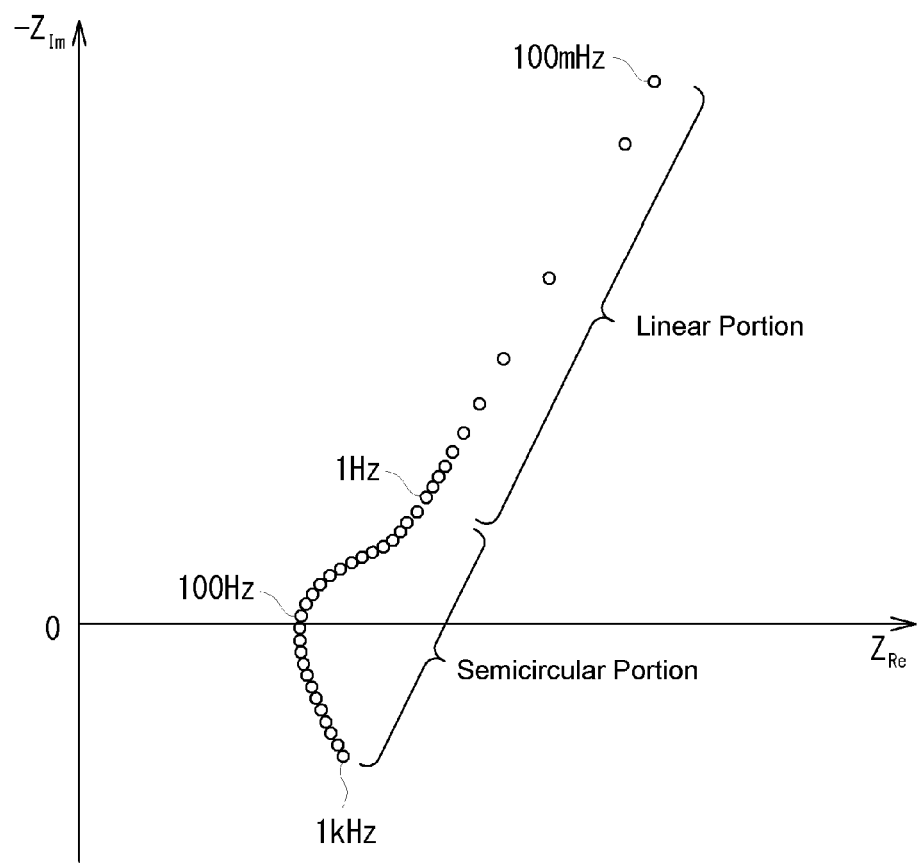
FIG. 3 is a graph illustrating an example of a Nyquist plot that shows the results of an alternating current impedance measurement for a module M.

With reference to FIG. 3, a Nyquist plot showing the results of an alternating current impedance measurement for a module M will be described. In FIG. 3, the horizontal axis represents the real component ($Z_{Re}$) of the alternating current impedance (complex impedance) of the module M, and the vertical axis represents the imaginary component ($-Z_{Im}$) of the alternating current impedance of the module M.

The measurement device 10 of the present embodiment applies application signals with various frequencies in the range of 100 mHz to 1 kHz to the module M. Since the signals with various frequencies are applied to the module M, the measurement results of alternating current impedance of the module M, which correspond to the frequencies of the signals, are plotted on a complex plane as discrete values, as shown in FIG. 3. Specifically, application signals with 52 different frequencies in the frequency range of 100 mHz to 1 kHz are used in the present embodiment. As a result, the resulting Nyquist plot has a semi-circular portion, which is obtained from application signals at high frequencies (from 1 Hz to 1 kHz in the example shown in FIG. 3), and a linear portion, which is obtained from application signals at low frequencies (from 100 mHz to 1 Hz).

The battery capacity estimating process of the present embodiment uses a neural network model in order to estimate the battery capacity (the fully charged capacity in the present embodiment) of the module M. Machine learning of the neural network model is performed so that, when data based on a measurement result of alternating current impedance are fed into the input layer of the neural network model, a highly accurate estimation result of battery capacity is output from the output layer of the neural network model. The details of an example of the learning method of the neural network model will be described later.

Relationship Between Elapsed Time from Completion of Charging and Discharging to Alternating Current Impedance Measurement and Measurement Result With reference to FIGS. 4 to 7, the following describes the relationship between the elapsed time after completion of charging and discharging of the module M until the alternating current impedance is measured and the measurement result of the alternating current impedance. The inventors of the present application have discovered that variations in the measurement results of alternating current impedance change according to the elapsed time after completion of charging and discharging of a secondary battery (a module M in the present embodiment) until the alternating current impedance is measured.

Figure 4:
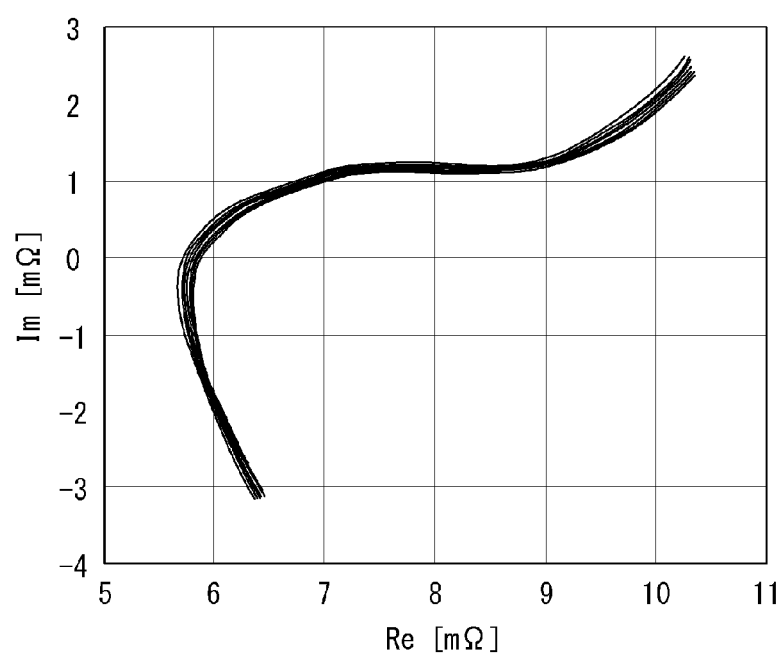
FIG. 4 is a graph illustrating an example of Nyquist plots obtained when alternating current impedance was measured a plurality of times while varying waiting time.
Figure 5:
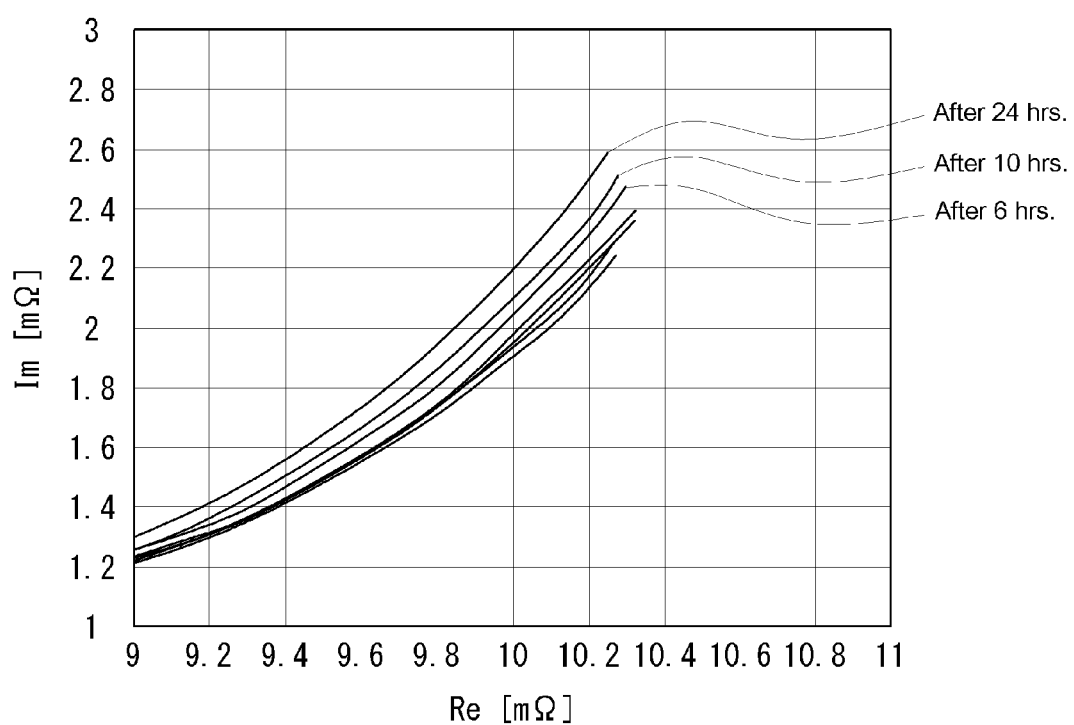
FIG. 5 is an enlarged view of the low frequency area of the graph shown in FIG. 4.

FIG. 4 is a graph illustrating an example of Nyquist plots obtained from the respective measurement results when the alternating current impedance of the same module M was measured a plurality of times while the elapsed time was varied from 0 minutes to 1,440 minutes. FIG. 5 is an enlarged view of the low frequency area of the graph shown in FIG. 4. As illustrated in FIG. 4, it is seen that the measurement results (the Nyquist plots in the present embodiment) vary when the elapsed time is changed, even though the measurement target module M is the same and the measurement method of alternating current impedance is the same. More specifically, variations in the measurement results change according to the elapsed time. As illustrated in FIG. 5, when the frequency of the application signal is in a low frequency range, the variations in the measurement results are particularly greater. It is demonstrated from the graph shown in FIG. 5 that the longer the waiting time, the greater the variations in the measurement results.

Figure 6:
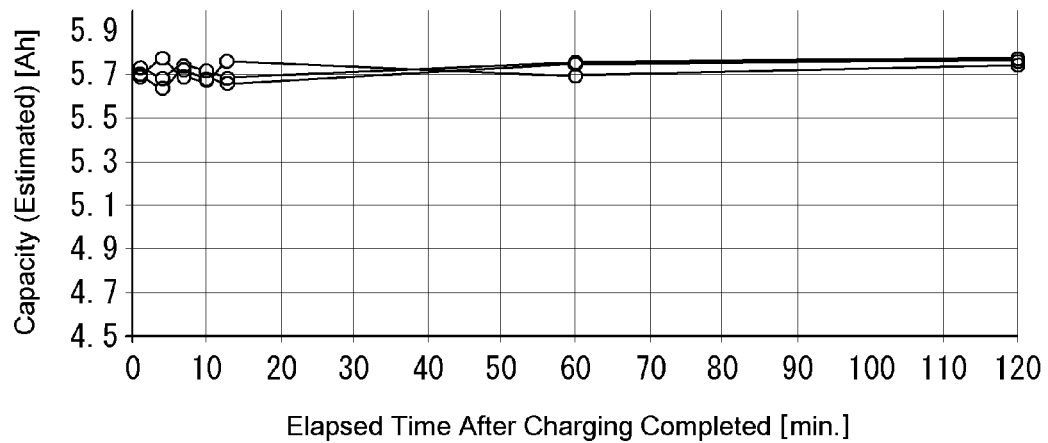
FIG. 6 is a graph illustrating the estimation results of the battery capacity of the module M when the elapsed time is varied from 0 minutes to 120 minutes.
Figure 7:
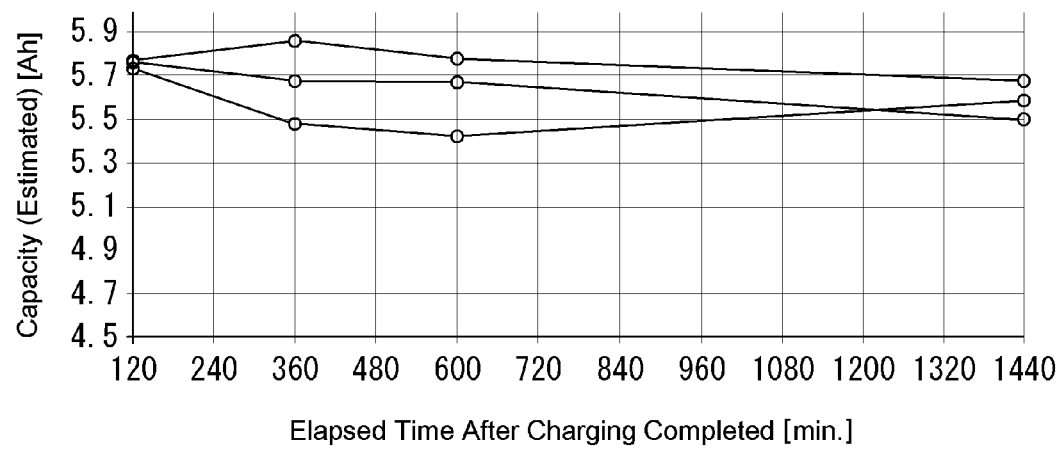
FIG. 7 is a graph illustrating the estimation results of the battery capacity of the module M when the elapsed time is varied from 120 minutes to 1440 minutes.

FIG. 6 is a graph illustrating the results of estimation of the battery capacity of the module M while the elapsed time is varied from 0 minutes to 120 minutes. FIG. 7 is a graph illustrating the results of estimation of the battery capacity of the module M while the elapsed time is varied from 120 minutes to 1,440 minutes. In the examples shown in FIGS. 6 and 7, all the modules M used as the target of battery capacity estimation were the same ones, and the alternating current impedances of the modules M were measured by the same method. In addition, the battery capacity estimation in the examples shown in FIGS. 6 and 7 is carried out by inputting data based on the measurement results of the alternating current impedance of the module M (data of Nyquist plots in the present embodiment) into the input layer of a pre-trained neural network model. The details of this battery capacity estimation method will be described later.

As illustrated in FIG. 6, with the module M of the present embodiment, variations in the estimation results were greater when the elapsed time was set to be less than or equal to 13 minutes than when the elapsed time was set to be longer than 13 minutes. Accordingly, when estimating the battery capacity of the module M of the present embodiment, the minimum waiting time is set to 13 minutes in advance, and the elapsed time after completion of charging and discharging until the alternating current impedance is measured is set to be longer than the minimum waiting time, so that the battery capacity can be estimated with higher accuracy.

In addition, as illustrated in FIG. 7, with the module M of the present embodiment, variations in the estimation results were greater when the elapsed time was set to be greater than or equal to 120 minutes than when the elapsed time was set to be shorter than 120 minutes. Accordingly, when estimating the battery capacity of the module M of the present embodiment, the maximum waiting time is set to 120 minutes in advance, and the elapsed time after completion of charging and discharging until the alternating current impedance is measured is set to be shorter than the maximum waiting time, so that the battery capacity can be estimated with higher accuracy.

Various causes are conceivable for the changes in the measurement results of the alternating current impedance (FIGS. 4 and 5) and the changes in the results of the battery capacity estimation based on the alternating current impedance (FIGS. 6 and 7). For example, it may be conceivable that, due to the electrochemical polarization resulting from charging and discharging of the secondary battery, variations in the results of the measurement and the results of the estimation change according to the elapsed time.

The foregoing experimental results demonstrate that the battery capacity estimation device 30 according to the present embodiment improves the accuracy of battery capacity estimation by setting the elapsed time after completion of charging and discharging of a module M to be longer than the minimum waiting time (13 minutes) and shorter than the maximum waiting time (120 minutes).

The experimental results illustrated in FIGS. 4 to 7 were obtained using a module M that includes six series-connected battery cells, each of which is composed of the previously-described nickel-metal hydride battery. Herein, variations in the results of the alternating current impedance measurement and variations in the results of the battery capacity estimation, which change according to the elapsed time, become different depending on conditions such as the type of the secondary battery, whether or not the secondary battery is a battery pack or a module, and the battery structure if the secondary battery is a battery pack or a module. For this reason, the specific values of the minimum waiting time and the maximum waiting time also vary depending on the conditions such as the type of the secondary battery and so forth. Therefore, the minimum waiting time and the maximum waiting time may be changed as appropriate depending on the conditions such as the type of the secondary battery and so forth.

Moreover, in the present embodiment, the elapsed time after completion of charging and discharging of the module M is set to be longer than the minimum waiting time (13 minutes) and shorter than the maximum waiting time (120 minutes). However, as illustrated in FIGS. 6 and 7, the present embodiment shows that the variations in the estimation results when the elapsed time is less than or equal to the minimum waiting time are smaller than the variations in the estimation results when the elapsed time is greater than or equal to the maximum waiting time. Therefore, the battery capacity estimation device 30 may not set the minimum waiting time and may set the elapsed time after completion of charging and discharging of the module M to be shorter than the maximum waiting time. Even in this case, the accuracy of estimation of the battery capacity is improved in comparison with the case where the elapsed time is not at all taken into consideration.

Neural Network Learning

Figure 8:
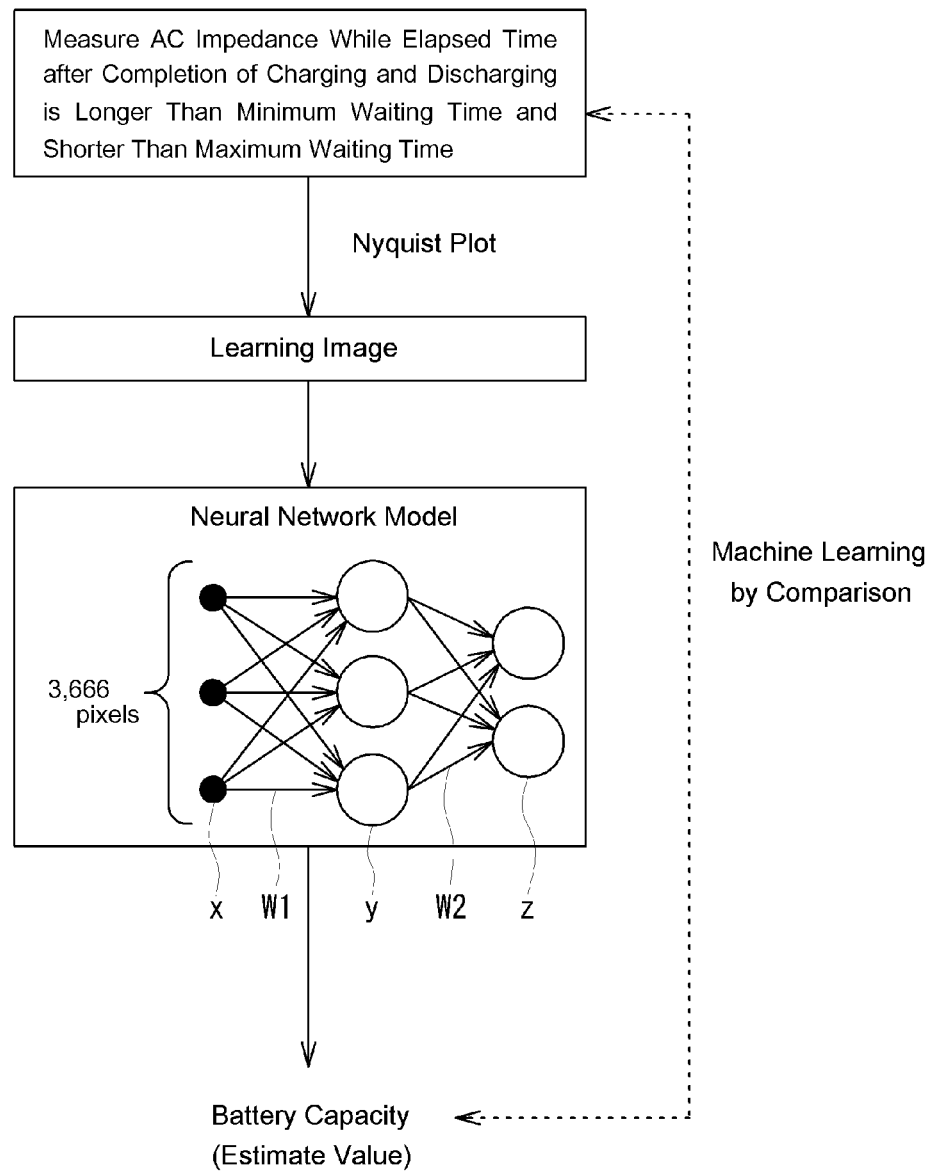
FIG. 8 is a schematic illustrative drawing for illustrating learning of a neural network model in the present embodiment.

With reference to FIG. 8, learning of a neural network model that is used for estimating the battery capacity of a module M will be described. First, an example of the neural network model is described. The neural network model in the present embodiment includes, for example, an input layer x, a hidden layer y, and an output layer z. The weighting between the input layer x and the hidden layer y is denoted as W1, and the weighting between the hidden layer y and the output layer z is denoted as W2. The neural network model of the present embodiment is trained using training data including input training data, which are the data relating to the alternating current impedances of the modules M, and output training data, which are the data relating to the actual battery capacities of the modules M. The actual battery capacity of a module M may be either an actual measurement value of battery capacity of the module M or an estimate value that has been estimated with high accuracy. For example, the actual measurement value of the fully charged capacity of a module M can be obtained by, for example, measuring the amount of charge required for charging the module M from the fully discharged state to the fully charged state.

The learning method of the neural network model in the present embodiment will be described below. First, a charging and discharging process is performed for a module M with the actual battery capacity (the fully charged capacity in the present embodiment) of which is known. The alternating current impedance of the module M is measured within a period in which the elapsed time after completion of the charging and discharging is longer than the above-described minimum waiting time and shorter than the above-described maximum waiting time. A Nyquist plot is obtained from the measurement results of the alternating current impedance. Thus, in the learning of the neural network model, the alternating current impedance of the module M is also measured during a period in which the elapsed time after completion of the charging and discharging is longer than the minimum waiting time and shorter than the maximum waiting time. As a result, the time condition for obtaining the Nyquist plots of the target secondary battery that is the target of battery capacity estimation is in agreement with the time condition for obtaining the Nyquist plots used for training the neural network model. Therefore, the pre-trained neural network model is optimized for estimating the battery capacity of the target secondary battery based on the Nyquist plots obtained after the elapse of the minimum waiting time and before the elapse of the maximum waiting time. As a result, the accuracy of estimation of the battery capacity is further improved.

Next, the data of learning image based on the obtained Nyquist plot are generated as input training data. The learning image of the present embodiment includes, for example, a region including 47 vertical pixels and 78 horizontal pixels, a total of 3,666 pixels. In the learning image, each of all the 3,666 pixels contains the information indicating whether or not it matches any of the alternating current impedance measurement results (Nyquist plots) at 52 different frequencies. Therefore, the effect of learning is stronger than the case where merely the alternating current impedance measurement results at 52 different frequencies are used as the input training data. As a result, the accuracy of estimation of the battery capacity is improved. It should be noted that the input layer x of the neural network model includes 3,666 nodes, which correspond to the 3,666 pixels. In addition, it is possible that the specific form of the learning image and the later-described estimation image may be modified. For example, instead of using the image of the Nyquist plot which contains a plurality of plot points in itself, it is possible to use an image containing a line or a region that is generated based on the plurality of plot points as the learning image and the estimation image. Alternatively, it is also possible to employ data other than image data (for example, the data of the Nyquist plot per se) as the data to be input into the neural network model.

Next, learning of the neural network model is conducted using the data of the learning image obtained from a module M as the input training data, and using the data of the actual battery capacity of the same module M as the output training data. More specifically, the present embodiment supplies learning image data to the input layer x of the neural network model, and acquires a battery capacity estimate value that is output from the output layer z. The acquired battery capacity estimate value is compared with the actual battery capacity, and the result of the comparison is fed back as a training signal to the neural network model. According to the training signal, the weightings W1 and W2 of the neural network model are adjusted. As the above-described procedure is repeated using a plurality of training data, the accuracy of estimation of the battery capacity is improved correspondingly.

Battery Capacity Estimation Process

Figure 9:
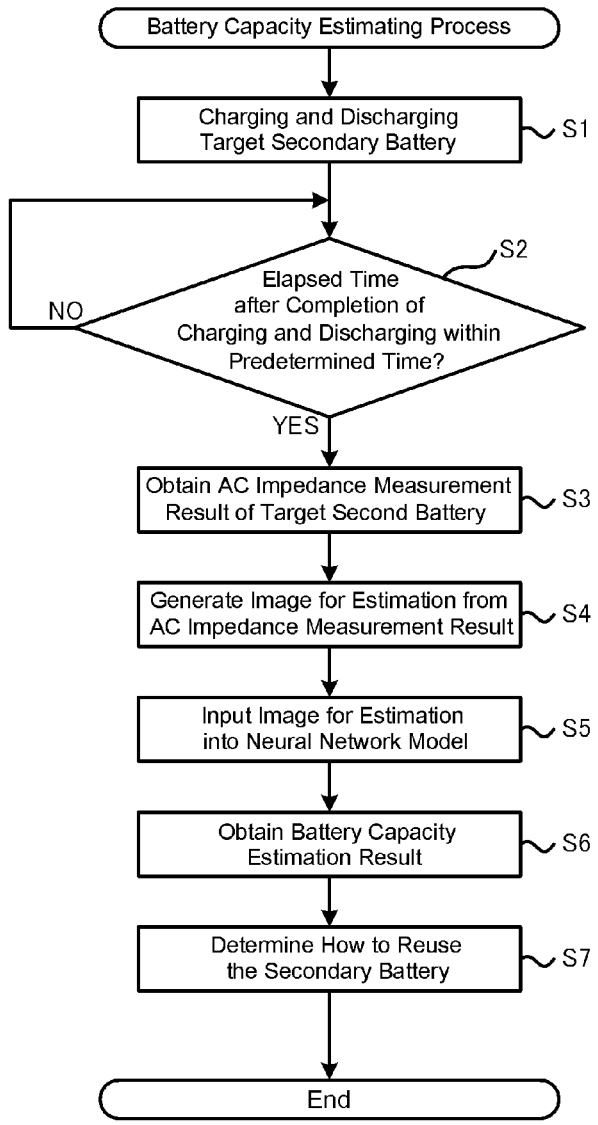
FIG. 9 is a flow-chart illustrating a battery capacity estimating process according to the present embodiment.

With reference to FIG. 9, a battery capacity estimating process executed by the battery capacity estimation system 1 will be described. The battery capacity estimating process of the present embodiment is executed by a control unit (for example, a controller, such as CPU, included in at least one of the charging and discharging device 5, the measurement device 10, and the battery capacity estimation device 30) included in the battery capacity estimation system 1. For example, when a start instruction for battery capacity estimation is input by an operating unit (not shown), the control unit of the battery capacity estimation system 1 executes the battery capacity estimating process illustrated in FIG. 9. Each of the steps of the battery capacity estimating process is basically implemented by software processing by the control unit. However, at least part of the process may be implemented by hardware (e.g., electric circuit). Also, a plurality of control units of a respective plurality of the devices may cooperate to execute the battery capacity estimating process.

First, the control unit performs charging and discharging of a module M (hereinafter referred to as a "target secondary battery") that is the target of performance evaluation (S1). As described previously, in the present embodiment, the charging and discharging device 5 performs the charging and discharging of the module M. Next, the control unit judges whether or not the elapsed time after completion of the charging and discharging is within a predetermined period (i.e., within a period that is longer than the above-described minimum waiting time and shorter than the maximum waiting time) (S2). If the elapsed time is not within the predetermined period (S2: NO), the battery capacity estimation system 1 enters a waiting state.

If the control unit judges that the elapsed time is within the predetermined period (S2: YES), the control unit acquires a measurement result of the alternating current impedance of the target secondary battery (S3). As described previously, in the present embodiment, the alternating current impedance of the target secondary battery is measured by the measurement device 10. The control unit generates an estimation image for estimating the battery capacity from the Nyquist plot showing the measurement results of the alternating current impedance of the target secondary battery (S4). The technique for generating the estimation image is similar to the above-described technique for generating the learning image. The control unit inputs the generated estimation image into the input layer x (see FIG. 8) of the pre-trained neural network model (S5). The control unit acquires the result of estimation of battery capacity, which is output from the output layer z (S6). Based on the acquired result of estimation of battery capacity, the control unit determines how to reuse the target secondary battery (S7). Then, the process ends.

It should be noted that the process of charging and discharging the target secondary battery at step S1 in FIG. 9 is an example of the "charging and discharging step/process". The process of acquiring an alternating current impedance at step S3 in FIG. 9 is an example of the "alternating current impedance acquiring step/process". The process of estimating the battery capacity at steps S4 to S6 in FIG. 9 is an example of the "battery capacity estimating step/process".

Although various embodiments of the present disclosure have been described in detail hereinabove, it should be understood that the foregoing embodiments are merely exemplary and are not intended to limit the scope of the claims. Various modifications and alterations of the embodiments described hereinabove are within the scope of the invention as defined by the appended claims.

What is claimed is:

1. A battery capacity estimation method for a secondary battery that has been used onboard in an electric vehicle comprising:
   a charging and discharging step of charging and discharging a target secondary battery collected from the electric vehicle;
   an alternating current impedance acquiring step of acquiring a measurement result of an alternating current impedance of the target secondary battery, by applying an alternating current signal within a specific frequency range to the target secondary battery after completion of the charging and discharging in the charging and discharging step and within a period after a predetermined minimum waiting time and before a predetermined maximum waiting time; and
   a battery capacity estimating step of estimating a battery capacity of the target secondary battery based on the measurement result of the alternating current impedance, wherein:
   the battery capacity estimating step includes obtaining an estimation result of the battery capacity of the target secondary battery by inputting data based on a Nyquist plot of the target secondary battery into a pre-trained neural network model;
   the pre-trained neural network model performs learning using a plurality of training data including data based on Nyquist plots indicating measurement results of alternating current impedance of a plurality of secondary batteries and actual battery capacities of the plurality of secondary batteries; and
   the predetermined minimum waiting time and the predetermined maximum waiting time is decided depending on a type of the secondary battery, whether or not the secondary battery is a battery pack or a battery module, and a battery structure based on the secondary battery being the battery pack or the battery module.

2. The battery capacity estimation method according to claim 1, wherein the pre-trained neural network model is trained based on the training data including data relating to the Nyquist plots of the secondary batteries after completion of the charging and discharging and before the maximum waiting time elapses.

* * * * *